United States Patent
Wang

(10) Patent No.: US 10,148,272 B2
(45) Date of Patent: Dec. 4, 2018

(54) FREQUENCY GENERATING CIRCUIT USING QUARTZ CRYSTAL RESONATOR

(71) Applicant: Ping-Ying Wang, Hsinchu (TW)

(72) Inventor: Ping-Ying Wang, Hsinchu (TW)

( * ) Notice: Subject to any disclaimer, the term of this patent is extended or adjusted under 35 U.S.C. 154(b) by 0 days.

(21) Appl. No.: 15/585,644

(22) Filed: May 3, 2017

(65) Prior Publication Data

US 2018/0323791 A1 Nov. 8, 2018

(51) Int. Cl.
*H03L 7/06* (2006.01)
*H03L 7/081* (2006.01)
*H03L 7/089* (2006.01)
*H03L 7/099* (2006.01)
*H03B 5/32* (2006.01)

(52) U.S. Cl.
CPC ............. *H03L 7/0814* (2013.01); *H03B 5/32* (2013.01); *H03L 7/0891* (2013.01); *H03L 7/0995* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 5,432,480 A | * | 7/1995 | Popescu .................. | H03L 7/087 327/156 |
| 7,519,113 B2 | * | 4/2009 | Aoyama ................ | G01R 29/26 324/76.53 |
| 7,701,268 B2 | * | 4/2010 | Kuwajima ................ | G06F 1/04 327/147 |
| 2009/0066380 A1 | * | 3/2009 | Redman-White .... | G11C 7/1051 327/158 |
| 2011/0204936 A1 | * | 8/2011 | Brenndorfer ............. | H03J 3/00 327/156 |
| 2013/0257496 A1 | * | 10/2013 | Hsin ........................ | H03L 7/085 327/157 |
| 2015/0070058 A1 | * | 3/2015 | Rada ....................... | H03F 3/193 327/156 |
| 2016/0164528 A1 | * | 6/2016 | Morton .................... | H03L 7/093 327/157 |

* cited by examiner

*Primary Examiner* — Adam Houston
(74) *Attorney, Agent, or Firm* — Birch, Stewart, Kolasch & Birch, LLP

(57) ABSTRACT

A frequency generating circuit includes: a delay circuit, arranged to operably delay an output frequency signal to generate a delayed signal; a quartz crystal resonator, coupled with the delay circuit, arranged to operably conduct a band-pass filtering operation on the delayed signal to generate the output frequency signal; and a delay control circuit, coupled with the delay circuit, arranged to operably control a phase delay amount of the delay circuit to thereby control the phase of the delayed signal.

11 Claims, 9 Drawing Sheets

FREQUENCY GENERATING CIRCUIT USING QUARTZ CRYSTAL RESONATOR

BACKGROUND

The disclosure generally relates to a frequency generating circuit and, more particularly, to a frequency generating circuit using a quartz crystal resonator as a band-pass filter.

A quartz crystal resonator is widely used in many frequency generating devices, such as the Pierce oscillator, due to its simple architecture and low cost merits. As is well known in related art, the noise level of the signal generated by the quartz crystal resonator can be reduced by increasing the current injected into the quartz crystal resonator. However, the increasing of the current injected into the quartz crystal resonator accelerates aging of the quartz crystal resonator, thereby reducing the reliability of the quartz crystal resonator. Namely, there is a trade-off between the reliability of the quartz crystal resonator and the noise level of the signal generated by the quartz crystal resonator. The above trade-off property limits the applicable fields of the quartz crystal resonator. For example, it is difficult to apply the quartz crystal resonator in many applications demanding low power consumption.

In addition, the pulling range (i.e., the frequency adjustable range or frequency tuning range) of the conventional frequency generating device is severely restricted by the parasitic capacitance of the quartz crystal resonator. Accordingly, the pulling range of the quartz crystal resonator is highly depending upon the material of the quartz crystal resonator. As a result, the conventional frequency generating device requires utilizing high-end quartz crystal resonators in order to meet the wide pulling range requirement. In this situation, the overall hardware cost of the conventional frequency generating device is inevitably increased.

SUMMARY

An example embodiment of a frequency generating circuit is disclosed comprising: a delay circuit, arranged to operably delay an output frequency signal to generate a delayed signal; a quartz crystal resonator, coupled with the delay circuit, arranged to operably conduct a band-pass filtering operation on the delayed signal to generate the output frequency signal; and a delay control circuit, coupled with the delay circuit, arranged to operably control a phase delay amount of the delay circuit to thereby control the phase of the delayed signal.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
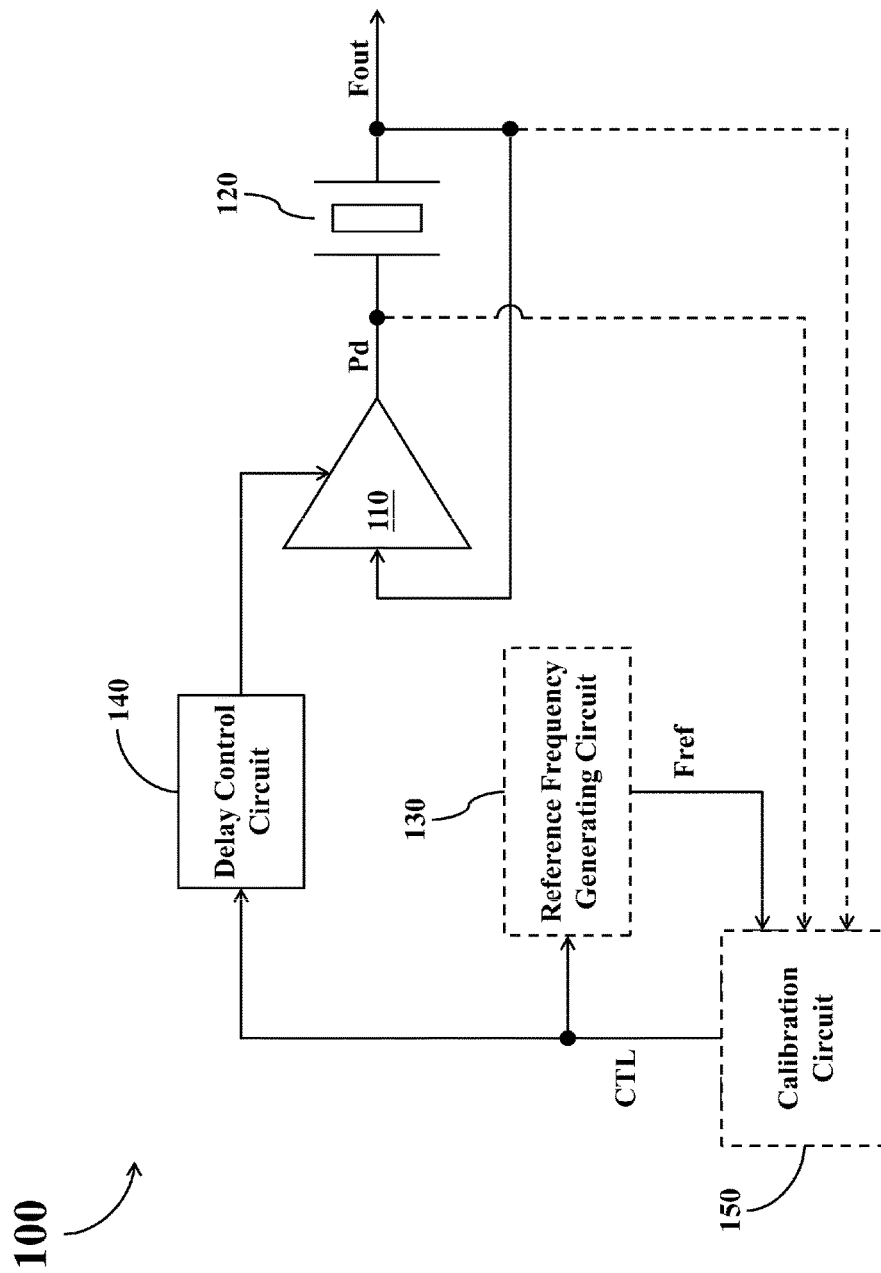
FIG. 1 shows a simplified functional block diagram of a frequency generating circuit according to one embodiment of the present disclosure.

FIG. 1 shows a simplified functional block diagram of a frequency generating circuit 100 according to one embodiment of the present disclosure. The frequency generating circuit 100 of this embodiment comprises a delay circuit 110, a quartz crystal resonator 120, a reference frequency generating circuit 130, a delay control circuit 140, and a calibration circuit 150.

The frequency generating circuit 100 is utilized for generating an output frequency signal Fout having a desirable frequency. The delay circuit 110 is arranged to operably delay the output frequency signal Fout to generate a delayed signal Pd. In this embodiment, the delayed signal Pd generated by the delay circuit 110 is realized in the format of a single-ended signal, so as to reduce the power consumption of the frequency generating circuit 100.

The quartz crystal resonator 120 is coupled with the output of the delay circuit 110 to receive the delayed signal Pd. In the frequency generating circuit 100, the quartz crystal resonator 120 is utilized to be a band-pass filter and arranged to operably conduct a band-pass filtering operation on the delayed signal Pd to generate the output frequency signal Fout. The frequency of the output frequency signal Fout is determined by the phase difference between the output signal of the quartz crystal resonator 120 and the input signal of the quartz crystal resonator 120. That is, the frequency of the output frequency signal Fout is determined by the phase difference between the output frequency signal Fout and the delayed signal Pd.

The reference frequency generating circuit 130 is arranged to operably generate a reference frequency signal Fref under control of a control signal CTL.

In this embodiment, the delay control circuit 140 is coupled with the delay circuit 110, and arranged to operably control a phase delay amount of the delay circuit 110 under control of the control signal CTL to thereby control the phase of the delayed signal Pd.

The calibration circuit 150 is coupled with the quartz crystal resonator 120, the reference frequency generating circuit 130, and the delay control circuit 140. The calibration circuit 150 is arranged to operably generate the control signal CTL according to the reference frequency signal Fref and one of the output frequency signal Fout and the delayed signal Pd, so as to control the reference frequency generating circuit 130 to adjust the frequency and/or phase of the reference frequency signal Fref. In this way, low-frequency noise components in the output frequency signal Fout can be effectively eliminated and the frequency of the output frequency signal Fout can be stabilized at a desirable value.

In practice, the delay circuit 110 may be realized with a single-ended voltage-controlled delay circuit or a digital-controlled delay circuit. For example, the delay circuit 110 may be realized with a ring oscillator or an appropriate delay line. The quartz crystal resonator 120 may be realized by various piezoelectric materials, such as ceramic resonator and aluminum nitride (AlN). The reference frequency generating circuit 130 may be realized with various circuits capable of generating a periodic signal having a certain frequency. For example, the reference frequency generating circuit 130 may be realized with a LC oscillator, a ring oscillator, a film bulk acoustic resonator (FBAR), a crystal oscillator, or an appropriate micro electro mechanical system (MEMS). The delay control circuit 140 may be realized with an appropriate non-OP circuit structure, such as a simple voltage buffer, or an appropriate OP-based circuit structure.

Different functional blocks of the frequency generating circuit 100 may be realized with separate circuits, or may be integrated into a single circuit chip.

As described previously, the frequency of the output frequency signal Fout is determined by the phase difference between the output frequency signal Fout and the delayed signal Pd. Therefore, the frequency of the output frequency signal Fout can be adjusted to a desirable value by adjusting the phase difference between the output frequency signal Fout and the delayed signal Pd. This means that the frequency of the output frequency signal Fout can be adjusted to a desirable value by adjusting the phase of the delayed signal Pd, instead of adjusting the magnitude of the input current of the quartz crystal resonator 120.

In the frequency generating circuit 100, the calibration circuit 150 utilizes the control signal CTL to calibrate the phase difference between the output frequency signal Fout and the delayed signal Pd. In practice, the calibration circuit 150 may dynamically conduct the phase difference calibration operations from time to time, or may merely conduct the phase difference calibration operation in the initialization stage when the frequency generating circuit 100 is powered on.

In another aspect, the calibration circuit 150 also functions as a noise filtering circuit or a noise suppression circuit for reducing the noise components in the output frequency signal Fout by adopting an indirect feedback control mechanism. Therefore, there is no need to reduce the noise level of the output frequency signal Fout by increasing the current to be injected into the quartz crystal resonator 120. As a result, the input current of the quartz crystal resonator 120 can be configured as low as possible to reduce power consumption and to improve the reliability of the quartz crystal resonator 120.

Figure 2:
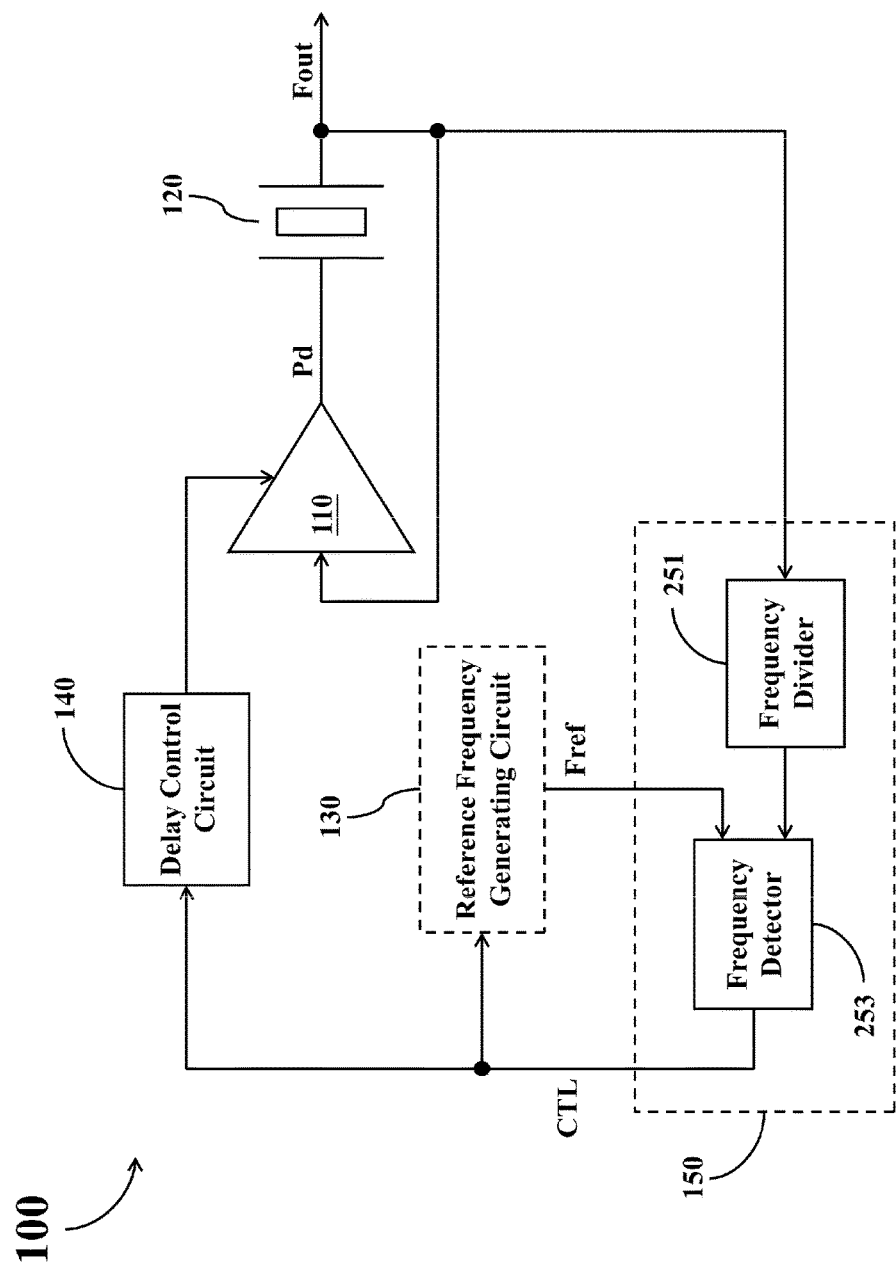
FIG. 2 shows a simplified functional block diagram of the calibration circuit in FIG. 1 according to a first embodiment of the present disclosure.
Figure 3:
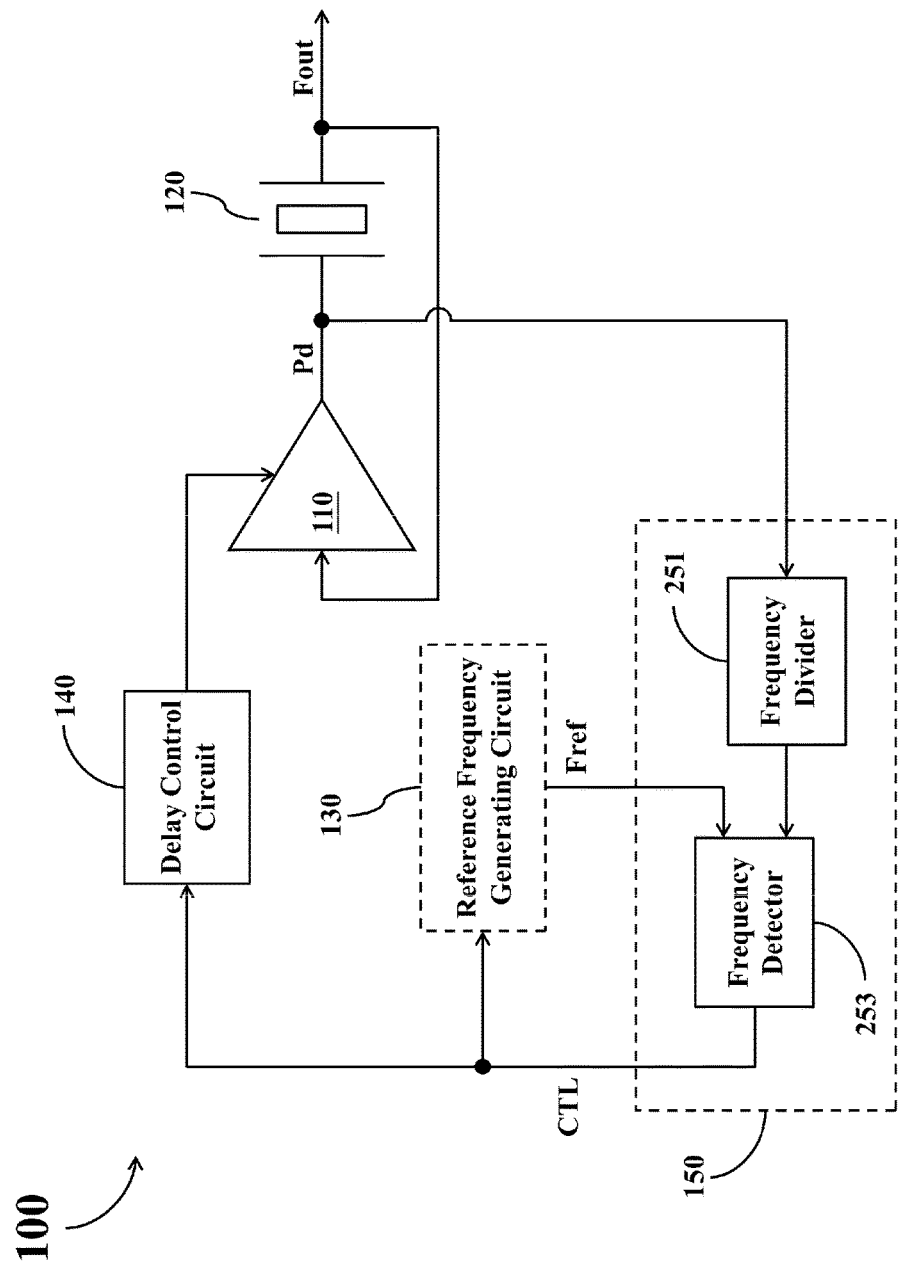
FIG. 3 shows a simplified functional block diagram of the calibration circuit in FIG. 1 according to a second embodiment of the present disclosure.

Please refer to FIG. 2 and FIG. 3. FIG. 2 shows a simplified functional block diagram of the calibration circuit 150 according to a first embodiment of the present disclosure. FIG. 3 shows a simplified functional block diagram of the calibration circuit 150 according to a second embodiment of the present disclosure.

In the embodiments of FIG. 2 and FIG. 3, the calibration circuit 150 comprises a frequency divider 251 and a frequency 253.

The frequency divider 251 in the embodiment of FIG. 2 is arranged to operably conduct a frequency dividing operation on the output frequency signal Fout to generate a first frequency-divided signal based on the output frequency signal Fout. The frequency divider 251 in the embodiment of FIG. 3 is arranged to operably conduct a frequency dividing operation on the delayed signal Pd to generate a second frequency-divided signal based on the delayed signal Pd.

The frequency detector 253 is coupled with the reference frequency generating circuit 130 and the delay control circuit 140, and arranged to operably compare a frequency difference between the reference frequency signal Fref and a target signal to generate the control signal CTL. In the embodiment of FIG. 2, the target signal refers to the first frequency-divided signal generated based on the output frequency signal Fout. In the embodiment of FIG. 3, the target signal refers to the second frequency-divided signal generated based on the delayed signal Pd.

The frequency divider 251 may be realized with various circuits capable of dividing the frequency of the output frequency signal Fout or the delayed signal Pd. For example, the frequency divider 251 may be realized with an integer-N frequency divider, a fractional-N frequency divider, a digital phased-locked loop (PLL) circuit, an analog PLL circuit, or a hybrid PLL circuit. In operations, the frequency divider 251 may divide the frequency of the output frequency signal Fout or the delayed signal Pd by a predetermined fixed divisor or by a programmable divisor.

In some embodiments where the frequency of the reference frequency signal Fref is configured to close to the frequency of the output frequency signal Fout or the delayed signal Pd, the frequency divider 251 in FIG. 2 and FIG. 3 may be omitted. In this situation, the frequency detector 253 may simply take the output frequency signal Fout or the delayed signal Pd as the target signal, and compare the frequency difference between the reference frequency signal Fref and the target signal to generate the control signal CTL.

Figure 4:
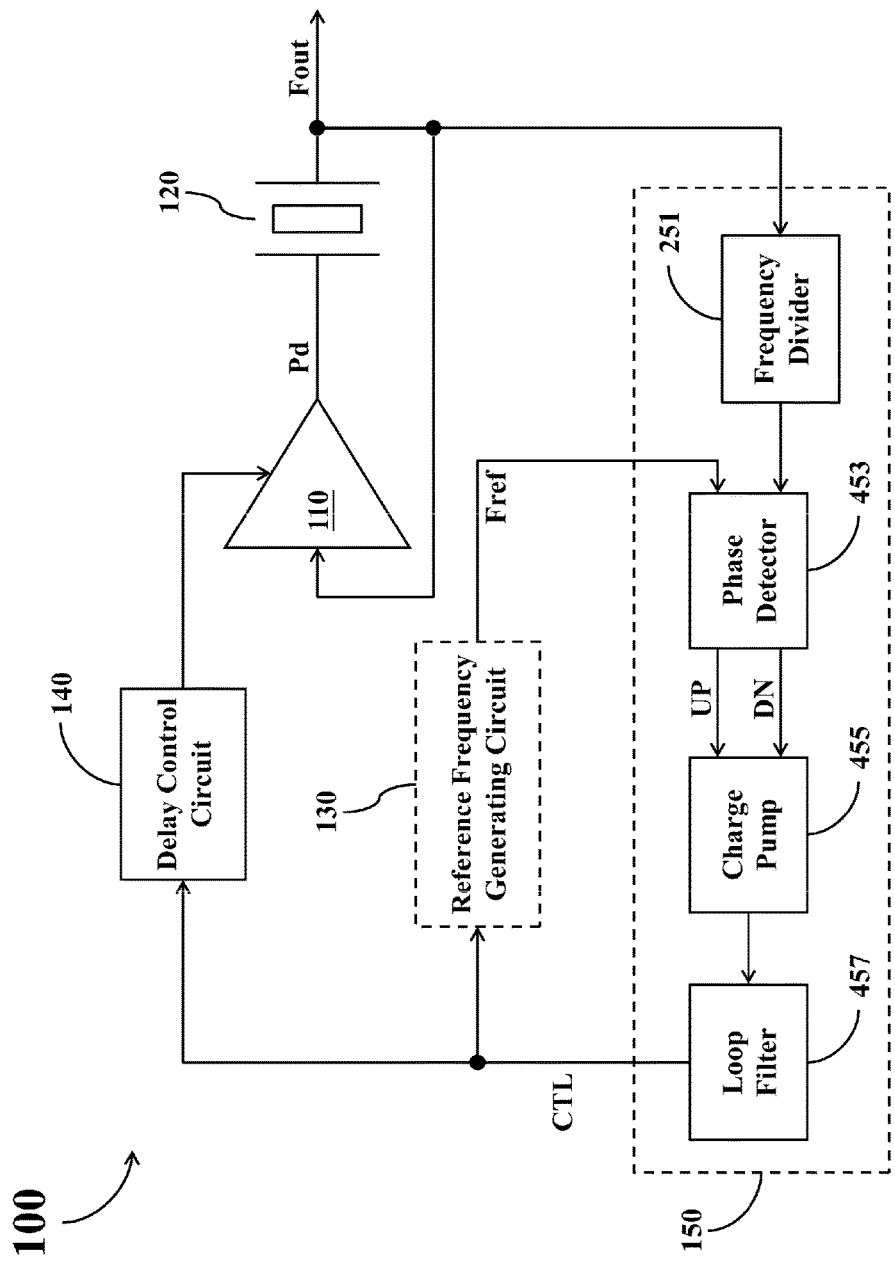
FIG. 4 shows a simplified functional block diagram of the calibration circuit in FIG. 1 according to a third embodiment of the present disclosure.
Figure 5:
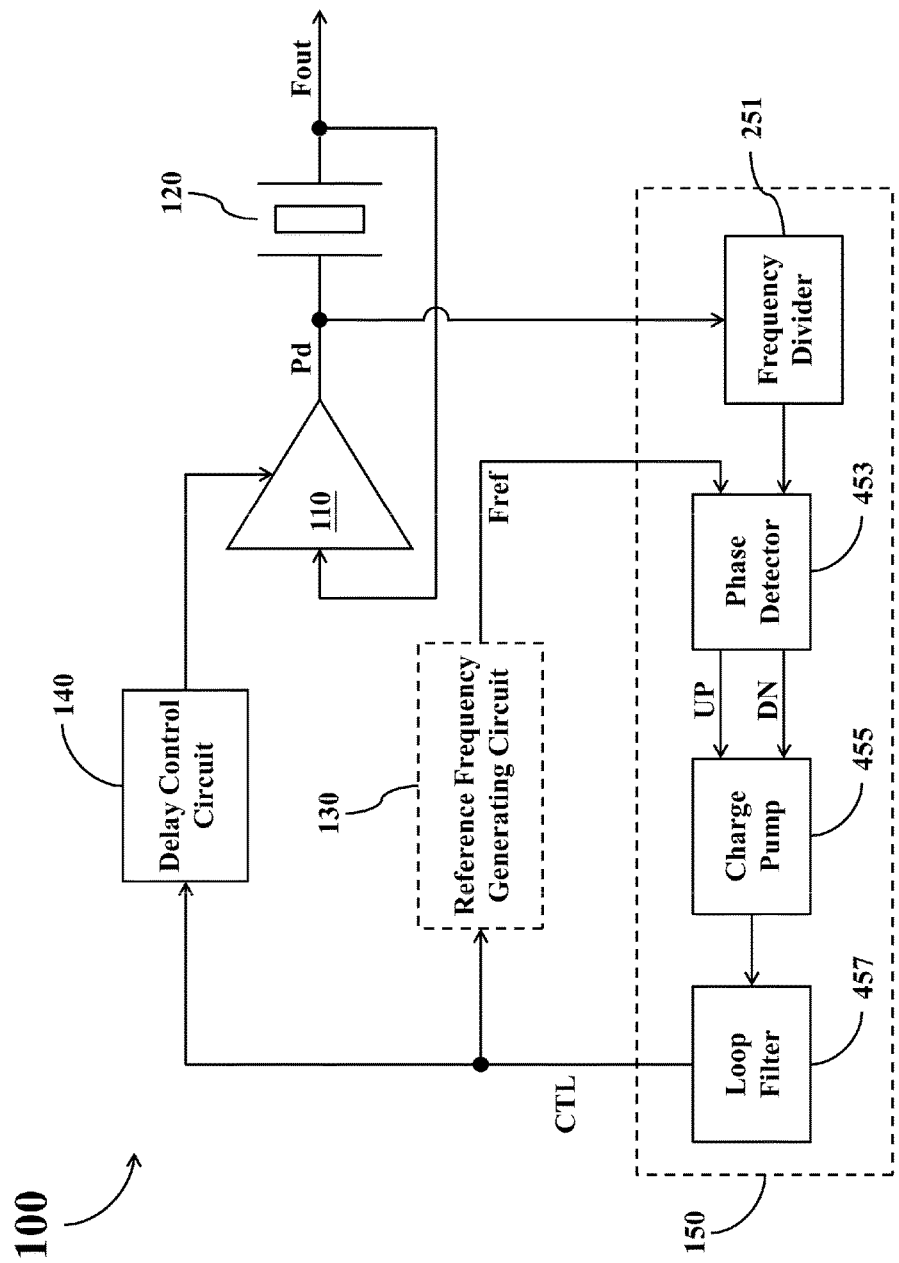
FIG. 5 shows a simplified functional block diagram of the calibration circuit in FIG. 1 according to a fourth embodiment of the present disclosure.

Please refer to FIG. 4 and FIG. 5. FIG. 4 shows a simplified functional block diagram of the calibration circuit 150 according to a third embodiment of the present disclosure. FIG. 5 shows a simplified functional block diagram of the calibration circuit 150 according to a fourth embodiment of the present disclosure.

In the embodiments of FIG. 4 and FIG. 5, the calibration circuit 150 comprises the frequency divider 251, a phase detector 453, a charge pump 455, and a loop filter 457.

The frequency divider 251 in the embodiment of FIG. 4 is arranged to operably conduct a frequency dividing operation on the output frequency signal Fout to generate a first frequency-divided signal based on the output frequency signal Fout. The frequency divider 251 in the embodiment of FIG. 5 is arranged to operably conduct a frequency dividing operation on the delayed signal Pd to generate a second frequency-divided signal based on the delayed signal Pd.

The phase detector 453 is coupled with the reference frequency generating circuit 130, and arranged to operably compare a phase difference between the reference frequency signal Fref and a target signal. In the embodiment of FIG. 4, the target signal refers to the first frequency-divided signal generated based on the output frequency signal Fout. In the embodiment of FIG. 5, the target signal refers to the second frequency-divided signal generated based on the delayed signal Pd.

The charge pump 455 is coupled with the phase detector 453, and arranged to operably generate an output voltage according to a detection result of the phase detector 453.

The loop filter 457 is coupled with the charge pump 455, the reference frequency generating circuit 130, and the delay control circuit 140. The loop filter 457 is and arranged to operably reduce noise in the output voltage of the charge pump 455 to generate the control signal CTL.

For example, the phase detector 453 may generate an up signal UP or a down signal DN to indicate the phase comparison result of the frequency signal Fout and the target signal. In this situation, the charge pump 455 conducts a charging or discharging operation in response to the up signal UP or the down signal DN. The loop filter 457 may performs a low-pass filtering operation on the output signal of the charge pump 455 to generate the control signal CTL.

In practice, the phase detector 453 may be realized with a phase and frequency detector, a bang-bang phase detector, or a digital phase detector.

In some embodiments where the frequency of the reference frequency signal Fref is configured to close to the frequency of the output frequency signal Fout or the delayed signal Pd, the frequency divider 251 in FIG. 4 and FIG. 5 may be omitted. In this situation, the phase detector 453 may simply take the output frequency signal Fout or the delayed signal Pd as the target signal, and compare the phase difference between the reference frequency signal Fref and the target signal to generate the up signal UP or the down signal DN.

Figure 6:
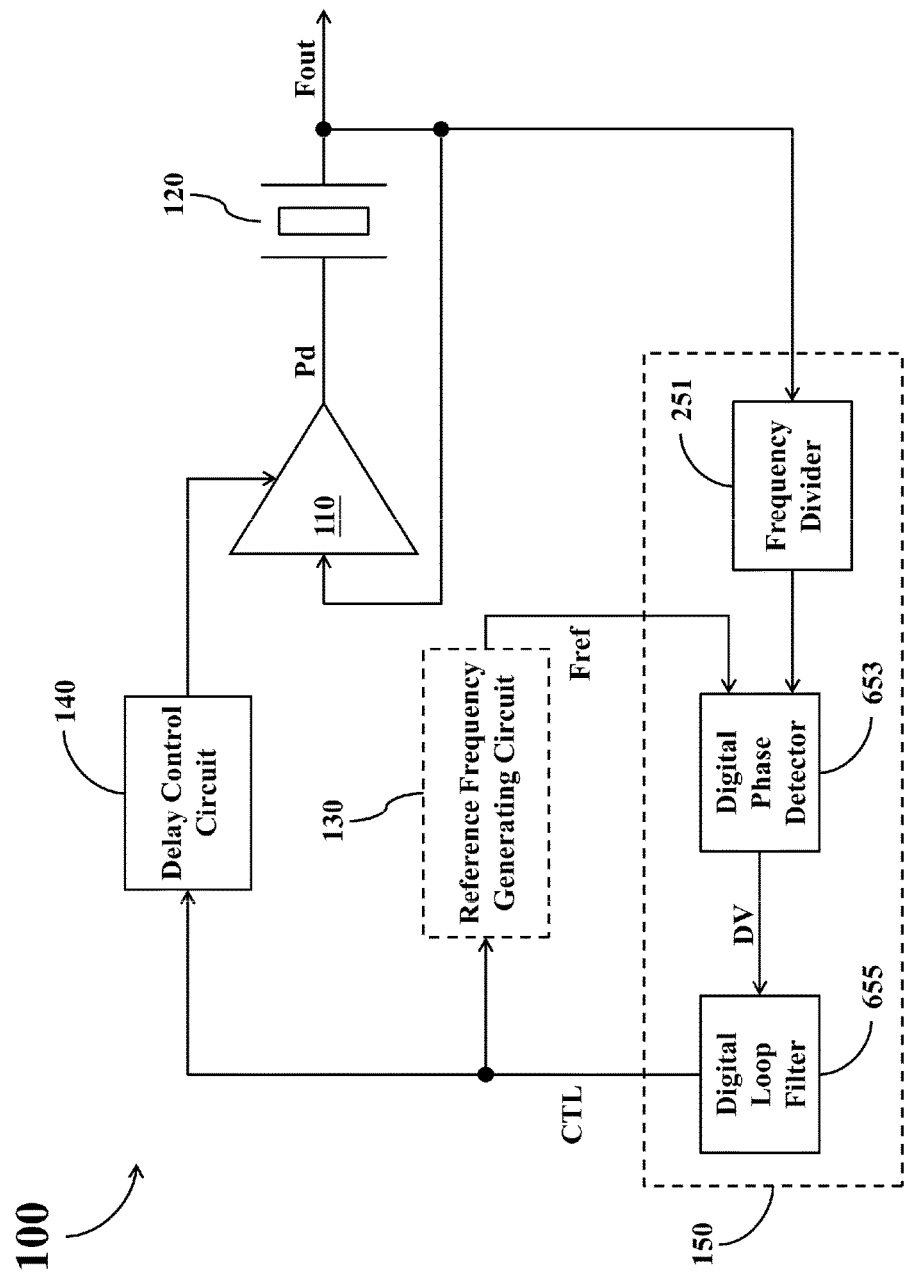
FIG. 6 shows a simplified functional block diagram of the calibration circuit in FIG. 1 according to a fifth embodiment of the present disclosure.
Figure 7:
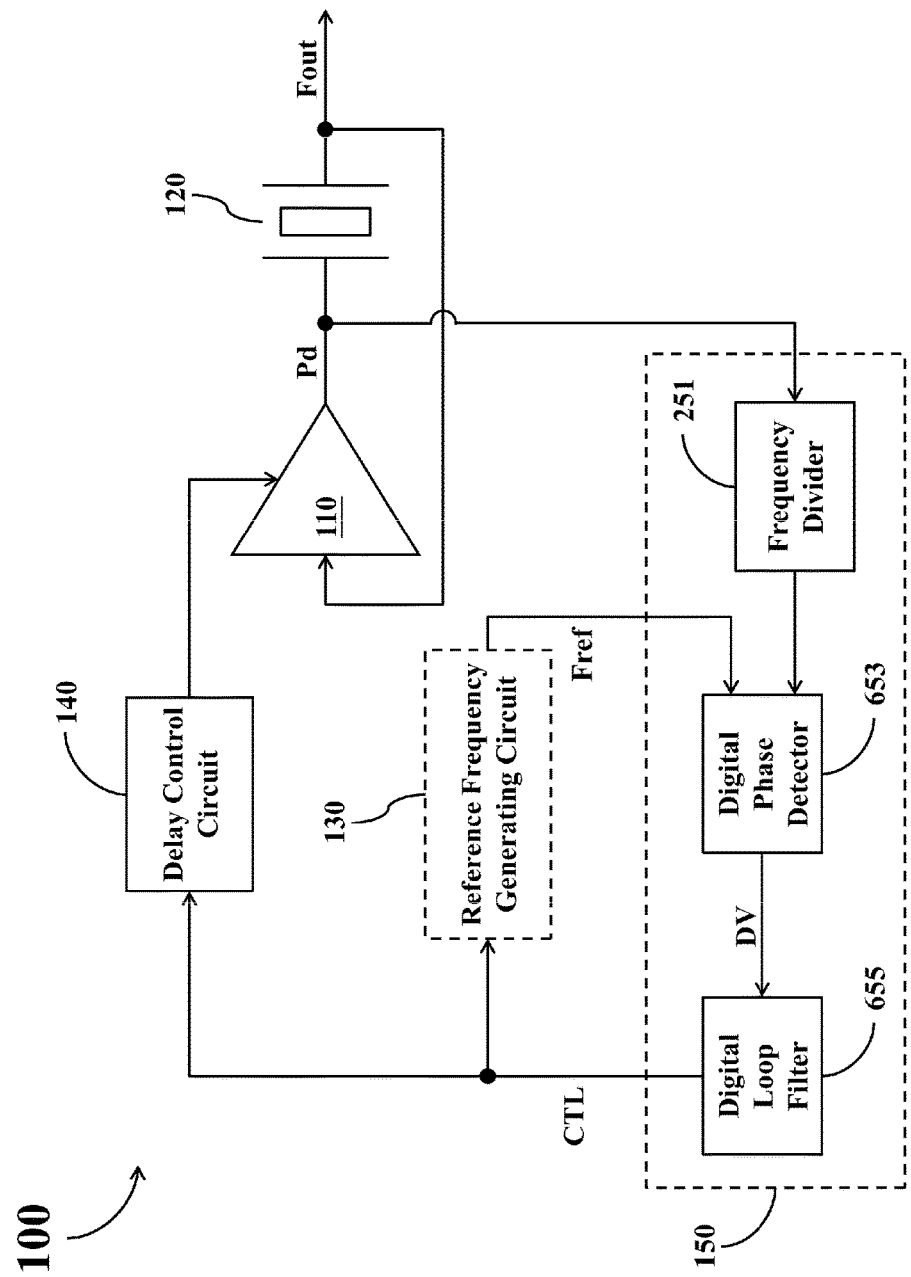
FIG. 7 shows a simplified functional block diagram of the calibration circuit in FIG. 1 according to a sixth embodiment of the present disclosure.

Please refer to FIG. 6 and FIG. 7. FIG. 6 shows a simplified functional block diagram of the calibration circuit 150 according to a fifth embodiment of the present disclosure. FIG. 7 shows a simplified functional block diagram of the calibration circuit 150 according to a sixth embodiment of the present disclosure.

In the embodiments of FIG. 6 and FIG. 7, the calibration circuit 150 comprises the frequency divider 251, a digital phase detector 653, and a digital loop filter 655.

The frequency divider 251 in the embodiment of FIG. 6 is arranged to operably conduct a frequency dividing operation on the output frequency signal Fout to generate a first frequency-divided signal based on the output frequency signal Fout. The frequency divider 251 in the embodiment of FIG. 7 is arranged to operably conduct a frequency dividing operation on the delayed signal Pd to generate a second frequency-divided signal based on the delayed signal Pd.

The digital phase detector 653 is coupled with the reference frequency generating circuit 130, and arranged to operably compare a phase difference between the reference frequency signal Fref and a target signal to generate a digital control value DV.

The digital loop filter 655 is coupled with the digital phase detector 653, the reference frequency generating circuit 130, and the delay control circuit 140. The digital loop filter 655 is arranged to operably generate the control signal CTL according to the digital control value DV.

That is, the calibration circuit 150 in FIG. 6 or FIG. 7 is realized using an all-digital approach.

In some embodiments where the frequency of the reference frequency signal Fref is configured to close to the frequency of the output frequency signal Fout or the delayed signal Pd, the frequency divider 251 in FIG. 6 and FIG. 7 may be omitted. In this situation, the digital phase detector 653 may simply take the output frequency signal Fout or the delayed signal Pd as the target signal, and compare the phase difference between the reference frequency signal Fref and the target signal to generate the digital control value DV.

It can be appreciated from the foregoing descriptions that the noise components in the output frequency signal Fout can be filtered out due to the indirect feedback control operation conducted by the calibration circuit 150. Thus, there is no need to increase the current to be injected into the quartz crystal resonator 120 for reducing the noise caused by the quartz crystal resonator 120. As a result, the traditional trade-off between the reliability of the quartz crystal resonator and the noise level of the signal generated by the quartz crystal resonator no longer exists in the disclosed frequency generating circuit 100. This means that the noise level of the output frequency signal Fout can be effectively reduced while maintaining the input current of the quartz crystal resonator 120 at a low level.

Accordingly, the quartz crystal resonator 120 can operate with small input current, and thus the frequency generating circuit 100 is very suitable for low power consumption applications.

In addition, as described previously, the frequency of the output frequency signal Fout is determined by the phase difference between the output signal and the input signal of the quartz crystal resonator 120, and can be adjusted to a desirable value by adjusting the phase difference between the output signal and the input signal of the quartz crystal resonator 120. In other words, the frequency tuning range, i.e., the pulling range, of the output frequency signal Fout is independent from the parasitic capacitance of the quartz crystal resonator 120. This means that the frequency tuning range of the frequency generating circuit 100 is no longer restricted by the material property of the quartz crystal resonator 120. Therefore, the pulling range of the frequency generating circuit 100 can be increased by adopting a normal quartz crystal resonator, instead of a high-end quartz crystal resonator. As a result, the overall hardware cost of the frequency generating circuit 100 can be reduced.

As described previously, the reference frequency generating circuit 130 may be realized with various circuits, such as a LC oscillator, a ring oscillator, a FBAR, a crystal oscillator, or an appropriate MEMS. In addition, the reference frequency generating circuit 130 may be realized with a simple voltage-controlled delay circuit to simplify the circuitry structure of the frequency generating circuit 100.

Figure 8:
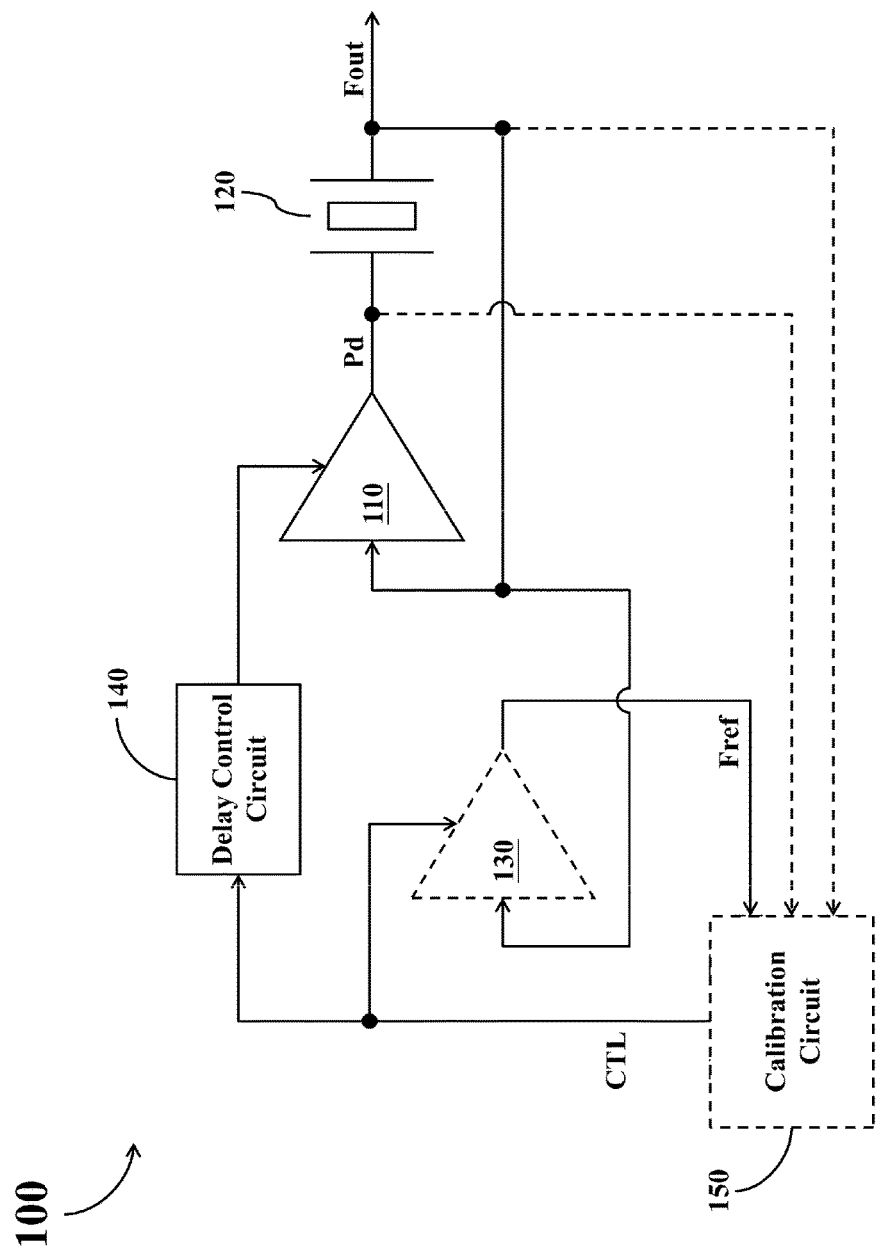
FIG. 8 shows a simplified functional block diagram of the reference frequency generating circuit in FIG. 1 according to one embodiment of the present disclosure.

For example, FIG. 8 shows a simplified functional block diagram of the reference frequency generating circuit 130 according to one embodiment of the present disclosure. In the embodiment of FIG. 8, the reference frequency generating circuit 130 is realized with a voltage-controlled delay circuit, wherein the input of voltage-controlled delay circuit is coupled with the quartz crystal resonator 120 to operably receive the output frequency signal Fout.

In this embodiment, the reference frequency generating circuit 130 takes the control signal CTL as an operating voltage and is arranged to operably delay the output frequency signal Fout to generate the reference frequency signal Fref. In other words, the calibration circuit 150 may utilize the control signal CTL to be the operating voltage of the reference frequency generating circuit 130 so as to control a phase delay amount of the reference frequency generating circuit 130.

The foregoing descriptions regarding the implementations, connections, operations, and related advantages of other corresponding functional blocks in the embodiment of FIG. 1 are also applicable to the embodiment of FIG. 8. For the sake of brevity, those descriptions will not be repeated here.

Figure 9:
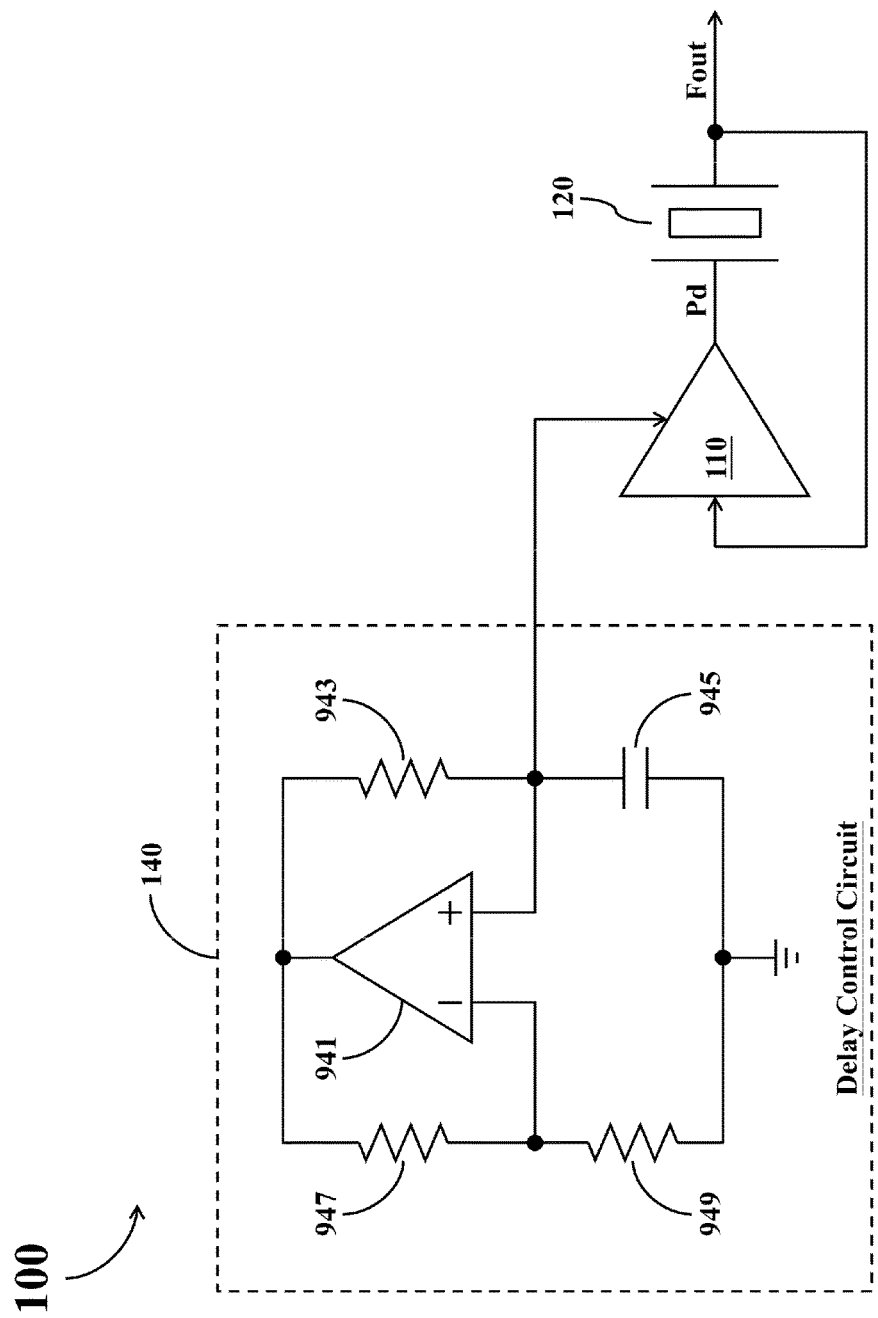
FIG. 9 shows a simplified functional block diagram of the delay control circuit in FIG. 1 according to one embodiment of the present disclosure.

FIG. 9 shows a simplified functional block diagram of the delay control circuit 140 according to one embodiment of the present disclosure. In the embodiment of FIG. 9, the delay control circuit 140 is realized with an OP-based circuit structure where an operational amplifier is employed.

As shown in FIG. 9, the delay control circuit 140 of this embodiment comprises an operational amplifier 941, a first resistance element 943, a capacitor 945, a second resistance element 947, and a third resistance element 949.

The operational amplifier 941 comprises a first input terminal (+), a second input terminal (−), and an output terminal. The first resistance element 943 is coupled between the output terminal and the first input terminal (+) of the operational amplifier 941. The capacitor 945 is coupled between the first input terminal (+) of the operational amplifier 941 and a fixed-voltage terminal (such as a grounded terminal). The second resistance element 947 is coupled between the output terminal and the second input terminal (−) of the operational amplifier 941. The third resistance element 949 is coupled between the second input terminal (−) of the operational amplifier 941 and the fixed-voltage terminal.

In this embodiment, the first input terminal (+) of the operational amplifier 941 is coupled with the delay circuit 110 and arranged to operably control the phase delay amount of the delay circuit 110. The capacitor 945 is arranged to operably reduce noise of the signal to be transmitted from the delay control circuit 140 to the delay circuit 110.

For example, the first input terminal (+) of the operational amplifier 941 may be configured to operably provide an operating voltage of the delay circuit 110. That is, the voltage provided from the first input terminal (+) of the operational amplifier 941 may be utilized as the operating voltage of the delay circuit 110. In this situation, the phase delay amount of the delay circuit 110 is controlled by the voltage provided from the first input terminal (+) of the operational amplifier 941.

In operations, the equivalent transconductance value of the delay circuit 110 changes as the temperature of the delay circuit 110 changes. For example, when the delay circuit 110 operates at the substantial region, the equivalent transconductance value of the delay circuit 110 would increase as the temperature of the delay circuit 110 increases.

Since the delay control circuit 140 of this embodiment is realized with an OP-based circuit structure as shown in FIG. 9, the impendence matching between both sides of the operational amplifier 941 would be automatically achieved due to the circuit characteristics of the OP-based circuit structure. Therefore, in the embodiment of FIG. 9, when the equivalent transconductance value of the delay circuit 110 increases as the temperature raises, the voltage provided at the first input terminal (+) of the operational amplifier 941 would be adaptively reduced to thereby adjust the delay amount of the delay circuit 110.

On the other hand, when the equivalent transconductance value of the delay circuit 110 reduces as the temperature drops, the voltage provided at the first input terminal (+) of the operational amplifier 941 would be adaptively increased to thereby adjust the delay amount of the delay circuit 110.

In another aspect, the delay control circuit 140 realized with the OP-based circuit structure is capable of adaptively adjusting the delay amount of the delay circuit 110 when the temperature changes. In other words, when the delay control circuit 140 is realized with the OP-based circuit structure as shown in FIG. 9, the delay control circuit 140 is enabled to control the phase delay amount of the delay circuit 110 alone, without relying upon the control of the control signal CTL generated by the calibration circuit 150.

In this situation, the operations of the delay control circuit 140 in the embodiment of FIG. 9 needs not to be controlled by the calibration circuit 150 as described in the previous embodiments. Accordingly, the reference frequency generating circuit 130 and the calibration circuit 150 employed in the previous embodiments may be both omitted in the embodiment of FIG. 9 to further simplify the circuitry complexity.

The foregoing descriptions regarding the implementations, connections, operations, and related advantages of the quartz crystal resonator 120 in the embodiment of FIG. 1 are also applicable to the embodiment of FIG. 9. For the sake of brevity, those descriptions will not be repeated here.

In some embodiments, the capacitor 945 of the delay control circuit 140 may be omitted or may be instead arranged in a circuit board where the frequency generating circuit 100 resides.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The term "voltage signal" used throughout the description and the claims may be expressed in the format of a current in implementations, and the term "current signal" used throughout the description and the claims may be expressed in the format of a voltage in implementations.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A frequency generating circuit (100), comprising:
   a delay circuit (110), arranged to operably delay an output frequency signal (Fout) to generate a delayed signal (Pd);
   a quartz crystal resonator (120), coupled with the delay circuit (110), arranged to operably conduct a band-pass filtering operation on the delayed signal (Pd) to generate the output frequency signal (Fout);
   a reference frequency generating circuit (130) arranged to operably generate a reference frequency signal (Fref) under control of a control signal (CTL);
   a delay control circuit (140), coupled with the delay circuit (110), arranged to operably control a phase delay amount of the delay circuit (110) to thereby control the phase of the delayed signal (Pd); and
   a calibration circuit (150), coupled with the quartz crystal resonator (120), the reference frequency generating circuit (130), and the delay control circuit (140), arranged to operably generate the control signal (CTL) according to the reference frequency signal (Fref) and one of the output frequency signal (Fout) and the delayed signal (Pd).

2. The frequency generating circuit (100) of claim 1, wherein the reference frequency generating circuit (130) is further coupled with the quartz crystal resonator (120) and arranged to operably delay the output frequency signal (Fout) to generate the reference frequency signal (Fref);
  wherein the calibration circuit (150) is arranged to operably utilize the control signal (CTL) to control a phase delay amount of the reference frequency generating circuit (130).

3. The frequency generating circuit (100) of claim 2, wherein the reference frequency generating circuit (130) is a voltage-controlled delay circuit, and the calibration circuit (150) is arranged to operably provide the control signal (CTL) to be an operating voltage of the reference frequency generating circuit (130) so as to control the phase delay amount of the reference frequency generating circuit (130).

4. The frequency generating circuit (100) of claim 1, wherein the calibration circuit (150) comprises:
  a frequency detector (253), coupled with the reference frequency generating circuit (130) and the delay control circuit (140), arranged to operably compare a frequency difference between the reference frequency signal (Fref) and a target signal to generate the control signal (CTL);
  wherein the target signal is the output frequency signal (Fout), the delayed signal (Pd), a first frequency-divided signal generated based on the output frequency signal (Fout), or a second frequency-divided signal generated based on the delayed signal (Pd).

5. The frequency generating circuit (100) of claim 1, wherein the calibration circuit (150) comprises:
  a phase detector (453), coupled with the reference frequency generating circuit (130), arranged to operably compare a phase difference between the reference frequency signal (Fref) and a target signal;
  a charge pump (455), coupled with the phase detector (453), arranged to operably generate an output voltage according to a detection result of the phase detector (453); and
  a loop filter (457), coupled with the charge pump (455), the reference frequency generating circuit (130), and the delay control circuit (140), arranged to operably reduce noise in the output voltage of the charge pump (455) to generate the control signal (CTL);
  wherein the target signal is the output frequency signal (Fout), the delayed signal (Pd), a first frequency-divided signal generated based on the output frequency signal (Fout), or a second frequency-divided signal generated based on the delayed signal (Pd).

6. The frequency generating circuit (100) of claim 1, wherein the calibration circuit (150) comprises:
  a digital phase detector (653), coupled with the reference frequency generating circuit (130), arranged to operably compare a phase difference between the reference frequency signal (Fref) and a target signal to generate a digital control value (DV); and
  a digital loop filter (655), coupled with the digital phase detector (653), the reference frequency generating circuit (130), and the delay control circuit (140), arranged to operably generate the control signal (CTL) according to the digital control value (DV);
  wherein the target signal is the output frequency signal (Fout), the delayed signal (Pd), a first frequency-divided signal generated based on the output frequency signal (Fout), or a second frequency-divided signal generated based on the delayed signal (Pd).

7. The frequency generating circuit (100) of claim 1, wherein the delay control circuit (140) comprises:
  an operational amplifier (941) comprising a first input terminal (+) and a second input terminal (−), wherein the first input terminal (+) is coupled with the delay circuit (110) and arranged to operably control the phase delay amount of the delay circuit (110);
  a first resistance element (943), coupled between an output terminal and the first input terminal (+) of the operational amplifier (941);
  a second resistance element (947), coupled between the output terminal and the second input terminal (−) of the operational amplifier (941); and
  a third resistance element (949), coupled between the second input terminal (−) of the operational amplifier (941) and the fixed-voltage terminal.

8. The frequency generating circuit (100) of claim 7, wherein the first input terminal (+) of the delay control circuit (140) is configured to operably provide an operating voltage of the delay circuit (110).

9. The frequency generating circuit (100) of claim 1, wherein the delay circuit (110) comprises a ring oscillator.

10. A frequency generating circuit (100), comprising:
  a delay circuit (110), arranged to operably delay an output frequency signal (Fout) to generate a delayed signal (Pd);
  a quartz crystal resonator (120), coupled with the delay circuit (110), arranged to operably conduct a band-pass filtering operation on the delayed signal (Pd) to generate the output frequency signal (Fout); and
  a delay control circuit (140), coupled with the delay circuit (110), arranged to operably control a phase delay amount of the delay circuit (110) to thereby control the phase of the delayed signal (Pd);
  wherein the delay control circuit (140) comprises:
  an operational amplifier (941) comprising a first input terminal (+) and a second input terminal (−), wherein the first input terminal (+) is coupled with the delay circuit (110) and arranged to operably control the phase delay amount of the delay circuit (110);
  a first resistance element (943), coupled between an output terminal and the first input terminal (+) of the operational amplifier (941);
  a second resistance element (947), coupled between the output terminal and the second input terminal (−) of the operational amplifier (941); and
  a third resistance element (949), coupled between the second input terminal (−) of the operational amplifier (941) and the fixed-voltage terminal.

11. The frequency generating circuit (100) of claim 10, wherein the first input terminal (+) of the delay control circuit (140) is configured to operably provide an operating voltage of the delay circuit (110).

\* \* \* \* \*